(12) United States Patent
Hu et al.

(10) Patent No.: US 10,014,306 B2
(45) Date of Patent: Jul. 3, 2018

(54) MEMORY STRUCTURE AND MANUFACTURING METHOD FOR THE SAME

(71) Applicant: MACRONIX INTERNATIONAL CO., LTD., Hsinchu (TW)

(72) Inventors: Chih-Wei Hu, Miaoli County (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/290,242

(22) Filed: Oct. 11, 2016

(65) Prior Publication Data

US 2017/0323896 A1 Nov. 9, 2017

(30) Foreign Application Priority Data

May 4, 2016 (TW) .............................. 105113885 A

(51) Int. Cl.
*H01L 27/11519* (2017.01)
*H01L 27/1157* (2017.01)
(Continued)

(52) U.S. Cl.
CPC .. *H01L 27/11519* (2013.01); *H01L 21/28273* (2013.01); *H01L 21/28282* (2013.01);
(Continued)

(58) Field of Classification Search
CPC ........... H01L 27/11582; H01L 27/1157; H01L 27/11556; H01L 27/11578;
(Continued)

(56) References Cited

U.S. PATENT DOCUMENTS

| | | | |
|---|---|---|---|
| 8,624,316 B2 * | 1/2014 | Mizushima | ....... H01L 21/28282 257/324 |
| 2006/0187737 A1 | 8/2006 | Futatsuyama | |

(Continued)

FOREIGN PATENT DOCUMENTS

TW 201419375 A 5/2014

OTHER PUBLICATIONS

TIPO Office Action dated Dec. 8, 2016 in corresponding Taiwan application (No. 105113885).

*Primary Examiner* — Jonathan Han
(74) *Attorney, Agent, or Firm* — McClure, Qualey & Rodack, LLP

(57) ABSTRACT

A memory structure and a manufacturing method for the same are disclosed. The memory structure comprises memory segments. Each of the memory segments comprises a memory array region, a memory selecting region adjacent to the memory array region, a semiconductor gate electrode, a semiconductor channel connecting to the semiconductor gate electrode, a gate dielectric layer, a gate electrode layer, and channel layer. The gate electrode layer and the semiconductor channel are in the memory selecting region. The gate electrode layer and the semiconductor channel are separated from each other by the gate dielectric layer. The channel layer and the semiconductor gate electrode are in the memory array region. The channel layer and the semiconductor gate electrode are separated from each other by the gate dielectric layer.

10 Claims, 25 Drawing Sheets

(51) Int. Cl.
  *H01L 21/28*    (2006.01)
  *H01L 27/11524*  (2017.01)
  *H01L 27/11551*  (2017.01)
  *H01L 27/11565*  (2017.01)
  *H01L 27/11578*  (2017.01)

(52) U.S. Cl.
  CPC .... *H01L 27/1157* (2013.01); *H01L 27/11524* (2013.01); *H01L 27/11551* (2013.01); *H01L 27/11565* (2013.01); *H01L 27/11578* (2013.01)

(58) Field of Classification Search
  CPC ........... H01L 27/11565; H01L 29/7926; H01L 27/11524; H01L 27/11529; G11C 16/0483; G11C 16/08
  USPC ......... 257/324, E29.309; 365/185.11, 185.17
  See application file for complete search history.

(56) References Cited

U.S. PATENT DOCUMENTS

| | | |
|---|---|---|
| 2010/0226183 A1 | 9/2010 | Kim |
| 2010/0322004 A1 | 12/2010 | Won et al. |
| 2011/0018051 A1* | 1/2011 | Kim ................. H01L 27/11575 257/324 |
| 2011/0194357 A1* | 8/2011 | Han ....................... G11C 16/16 365/185.29 |
| 2013/0182502 A1* | 7/2013 | Cheo ..................... G11C 16/14 365/185.2 |
| 2015/0076586 A1* | 3/2015 | Rabkin .............. G11C 16/0483 257/324 |
| 2015/0092494 A1 | 4/2015 | Rhie |
| 2015/0138885 A1 | 5/2015 | Iwai et al. |

* cited by examiner

MEMORY STRUCTURE AND MANUFACTURING METHOD FOR THE SAME

This application claims the benefit of Taiwan application Serial No. 105113885, filed May 4, 2016, the subject matter of which is incorporated herein by reference.

BACKGROUND

Technical Field

The disclosure relates to a memory structure and a manufacturing method for the same, and particularly to a 3D NAND memory and a manufacturing method for the same.

Description of the Related Art

As critical dimensions of devices in integrated circuits shrink toward perceived limits of manufacturing technologies, designers have been looking to techniques to achieve greater storage capacity, and to achieve lower costs per bit. Technologies being pursued include multiple layers of memory cells on a single chip. Operations performed on a 3D (three-dimensional) NAND memory having multiple layers of memory cells include read, write and erase.

Typically, erase operations are performed by blocks of memory cells, where the general issue of high density NAND, and in particular high density 3D NAND, memories is that the size of a block of memory cells is often very large. This is not convenient if a user only needs to change the code of a small unit stored in a 3D NAND memory. As the density of 3D NAND memories increases, the number of layers in the stacks increase, leading to larger block sizes and further inconvenience in erase operations.

Thus, it is desirable to provide for a technology with more efficient and convenient erase operations in 3D NAND memories.

SUMMARY

The present disclosure relates to a memory structure and a method for manufacturing the same.

According to an embodiment, a memory structure is disclosed. The memory structure comprises memory segments. Each of the memory segments comprises a memory array region, a memory selecting region adjacent to the memory array region, a semiconductor gate electrode, a semiconductor channel connecting to the semiconductor gate electrode, a gate dielectric layer, a gate electrode layer, and channel layer. The gate electrode layer and the semiconductor channel are in the memory selecting region. The gate electrode layer and the semiconductor channel are separated from each other by the gate dielectric layer. The channel layer and the semiconductor gate electrode are in the memory array region. The channel layer and the semiconductor gate electrode are separated from each other by the gate dielectric layer.

According to another embodiment, a method for manufacturing a memory structure is disclosed, comprising the following steps. A semiconductor strip is formed on a substrate. The semiconductor strip comprises a semiconductor channel in a memory selecting region and a semiconductor gate electrode in a memory array region adjacent to the memory selecting region. A gate dielectric layer is formed on the semiconductor channel and the semiconductor gate electrode. A channel layer is formed on the gate dielectric layer in the memory array region. A gate electrode layer is formed on the gate dielectric layer in the memory selecting region.

The above and other embodiments of the disclosure will become better understood with regard to the following detailed description of the non-limiting embodiment(s). The following description is made with reference to the accompanying drawings.

DETAILED DESCRIPTION

Embodiments disclosure herein relate to a memory structure and a manufacturing method for the same. According to embodiments, one memory block of the memory structure comprising a plurality of memory segments, and each of the memory segments has a selecting device. Thus the memory segments of one memory block can be erased partially. The operating method is easy and convenient.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1A:
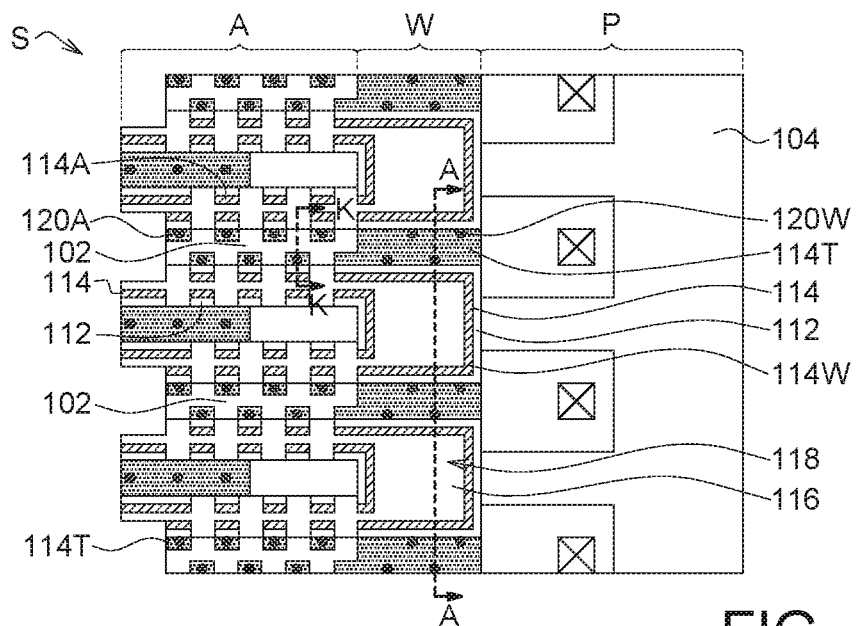
FIG. 1A illustrate a schematic top view of a memory segment of a memory structure according to an embodiment.

FIG. 1A illustrates a schematic top view of a memory segment S of a memory structure according to an embodiment. Strip stack 102 are extended from a stack structure 104 in a pad region P into a memory array region A and a memory selecting region W adjacent to the memory array region A.

Figure 1B:
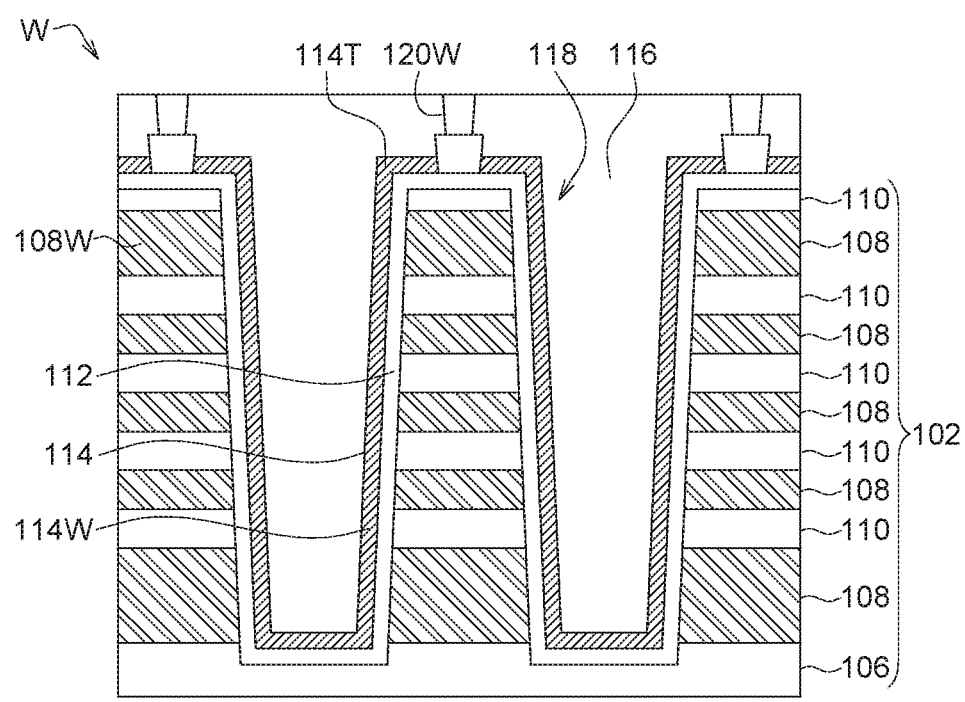
FIG. 1B illustrate a schematic cross-section view of a portion of a memory segment of a memory structure in a memory selecting region according to an embodiment.

FIG. 1B illustrates a schematic cross-section view in the memory selecting region W of the memory structure taken along AA line in FIG. 1A. The strip stack 102 comprises semiconductor strips 108 and insulating strips 110 alternately stacked on a substrate 106. The semiconductor strips 108 are separated from each other by the insulating strip 110s.

Referring to FIGS. 1A and 1B, a gate dielectric layer 112 is on the strip stack 102, and on the substrate 106 between the strip stacks 102. A semiconductor layer 114 is on the gate dielectric layer 112. An insulating layer 116 may be filled into an opening 118 between the strip stacks 102.

In embodiments, a portion of the semiconductor strip 108 in the memory selecting region W is functioned as a semiconductor channel 108W, and a portion of the semiconductor layer 114 in the memory selecting region W is functioned as a gate electrode layer 114W. The gate electrode layer 114W, the semiconductor channel 108W and the gate dielectric layer 112 between the gate electrode layer 114W and the semiconductor channel 108W in the memory selecting region W may construct a selecting device (or switching device), such as a word line selecting device. A conductive connecting element 120W may pass through the insulating layer 116 to electrically connect to a semiconductor portion 114T of the semiconductor layer 114 over an upper surface of the strip stack 102.

Figure 1C:
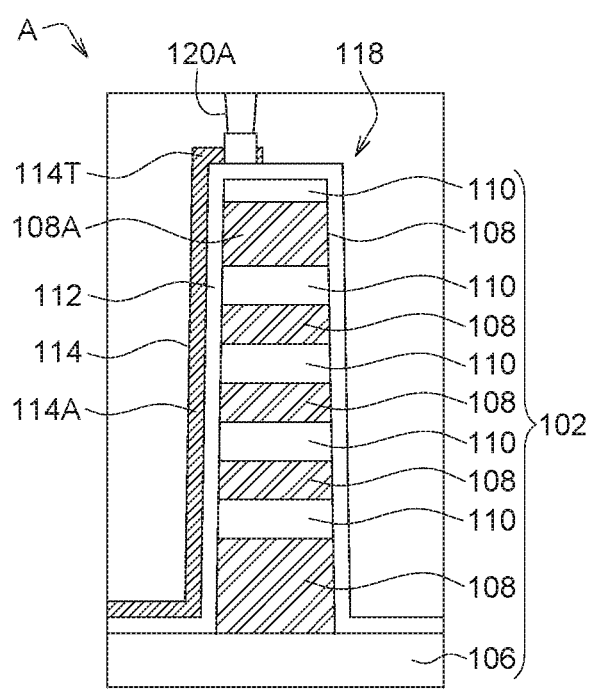
FIG. 1C illustrate a schematic cross-section view of a portion of a memory segment of a memory structure in a memory array region according to an embodiment.

FIG. 1C illustrates a schematic cross-section view in the memory array region A of the memory structure taken along KK line in FIG. 1A.

Referring to FIGS. 1A and 1C, a portion of the semiconductor strip 108 in the memory array region A is functioned as a semiconductor gate electrode 108A, and a portion of the semiconductor layer 114 in the memory array region A is functioned as a channel layer 114A. The gate dielectric layer 112 is between the semiconductor gate electrode 108A and the channel layer 114A. Memory cells of the memory array region A are defined at crisscross between the semiconductor gate electrode 108A and the channel layer 114A. A conductive connecting element 120A may pass the insulating layer 116 to electrically connect to the semiconductor portion 114T of the semiconductor layer 114 over the upper surface of the strip stack 102.

Referring to FIGS. 1A to 1C, in embodiments, the semiconductor strip 108 is extended in the memory array region A and the memory selecting region W as a continuous (or un-separated) strip structure, and thus in other words the semiconductor channel 108W in the memory selecting region W and the semiconductor gate electrode 108A in the memory array region A is (electrically and physically) connected to each other. In embodiments, of each of the semiconductor strip 108, the semiconductor channel 108W in the memory selecting region W and the semiconductor gate electrode 108A in the memory array region A may be at the same level in the stack, may have a coplanar structure, may have the same thickness, and/or may be formed simultaneously.

In embodiments, the selecting device in the memory selecting region W may be used to allow the memory cells of the selected memory segment S to be erased, or used to prevent the memory cells of the un-selected memory segment S from being erased.

Figure 2A:
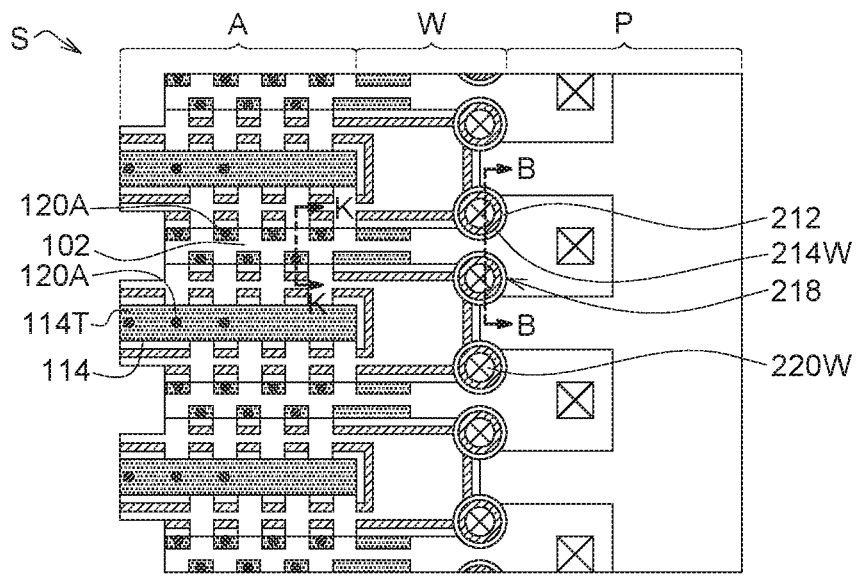
FIG. 2A illustrate a schematic top view of a memory segment of a memory structure according to an embodiment.
Figure 2B:
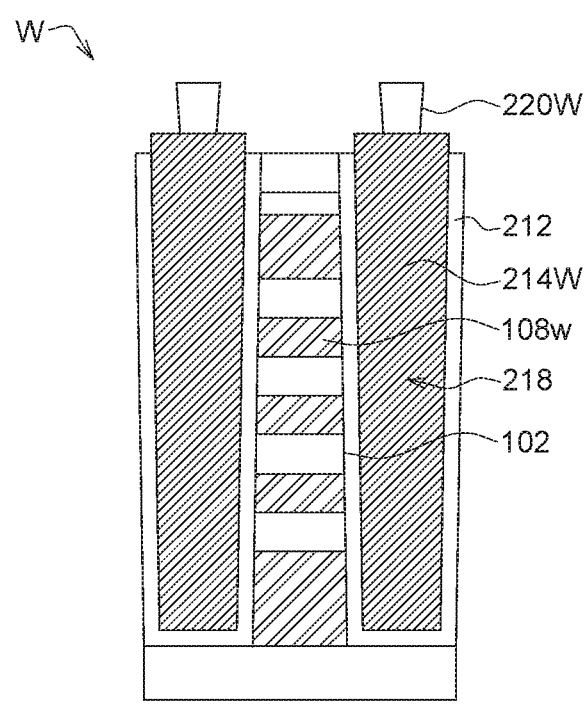
FIG. 2B illustrate a schematic cross-section view of a portion of a memory segment of a memory structure in a memory selecting region according to an embodiment.

FIG. 2A illustrates a schematic top view of the memory segment S of the memory structure according to another embodiment. FIG. 2B illustrates a schematic cross-section view of the memory structure taken along BB line in FIG. 2A. Differences between the memory structure as shown in FIGS. 2A and 2B and the memory structure as shown in FIGS. 1A and 1B are described as the following. In the memory selecting region W, a gate dielectric layer 212 and a gate electrode layer 214W are on a sidewall of the strip stack 102. The gate dielectric layer 212 is on a sidewall and a bottom surface of an opening 218, the gate electrode layer 214W is on the gate dielectric layer 212 and filled into the opening 218. The gate electrode layer 214W is surrounded by the gate dielectric layer 212. In the memory selecting region W, the gate electrode layer 214W, the semiconductor channel 108W and the gate dielectric layer 212 may be functioned as the selecting device. In embodiments, the selecting device may be used to allow the selected memory segment S to be erased, or used to prevent the un-selected memory segment S from being erased. A conductive connecting element 220W in the memory selecting region W may be electrically connected to the gate electrode layer 214W. The conductive connecting element 120A in the memory array region A may be electrically connected to the semiconductor portion 114T of the semiconductor layer 114 over the upper surface of the strip stack 102. In an embodiment, a portion in the memory array region A of the memory structure has a cross-section view similar to FIG. 1C, and is not described herein.

Figure 3:
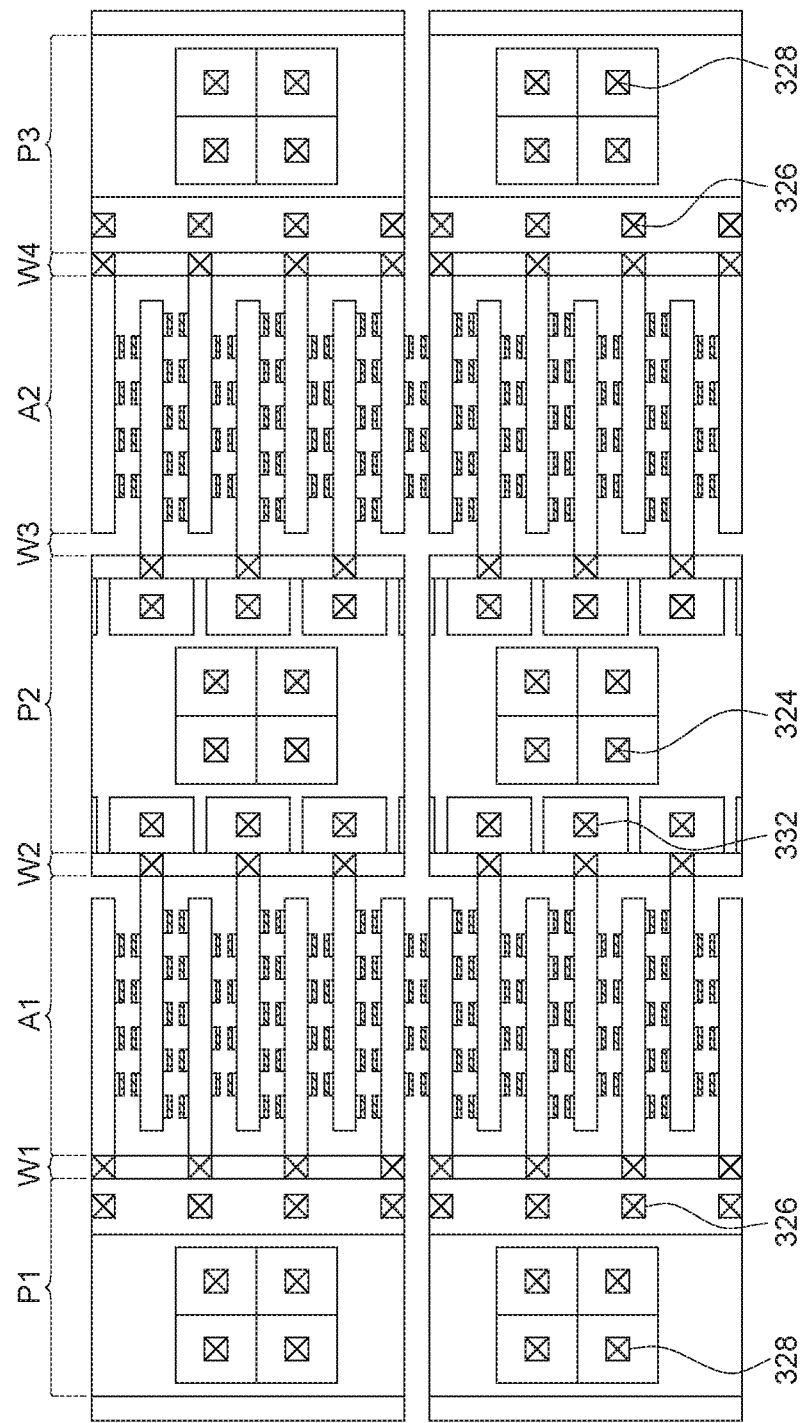
FIG. 3 is a schematic top view of a memory structure according to an embodiment.

FIG. 3 is a schematic top view of the memory structure according to an embodiment, showing having four memory segments. The memory selecting region (W1, W2, W3, W4) is between the memory array region (A1, A2) and the pad region (P1, P2, P3). In an embodiment, the pad region P2 comprises a SSL landing contact pad 332 and contact pads 324 at different levels of a stair structure, which may be electrically connected to a conductive connecting element. The pad region P1, P3 comprises a GSL landing contact pad 326 and contact pads 328 at different levels of a stair structure, which may be electrically connected to a conductive connecting element.

Figure 4:
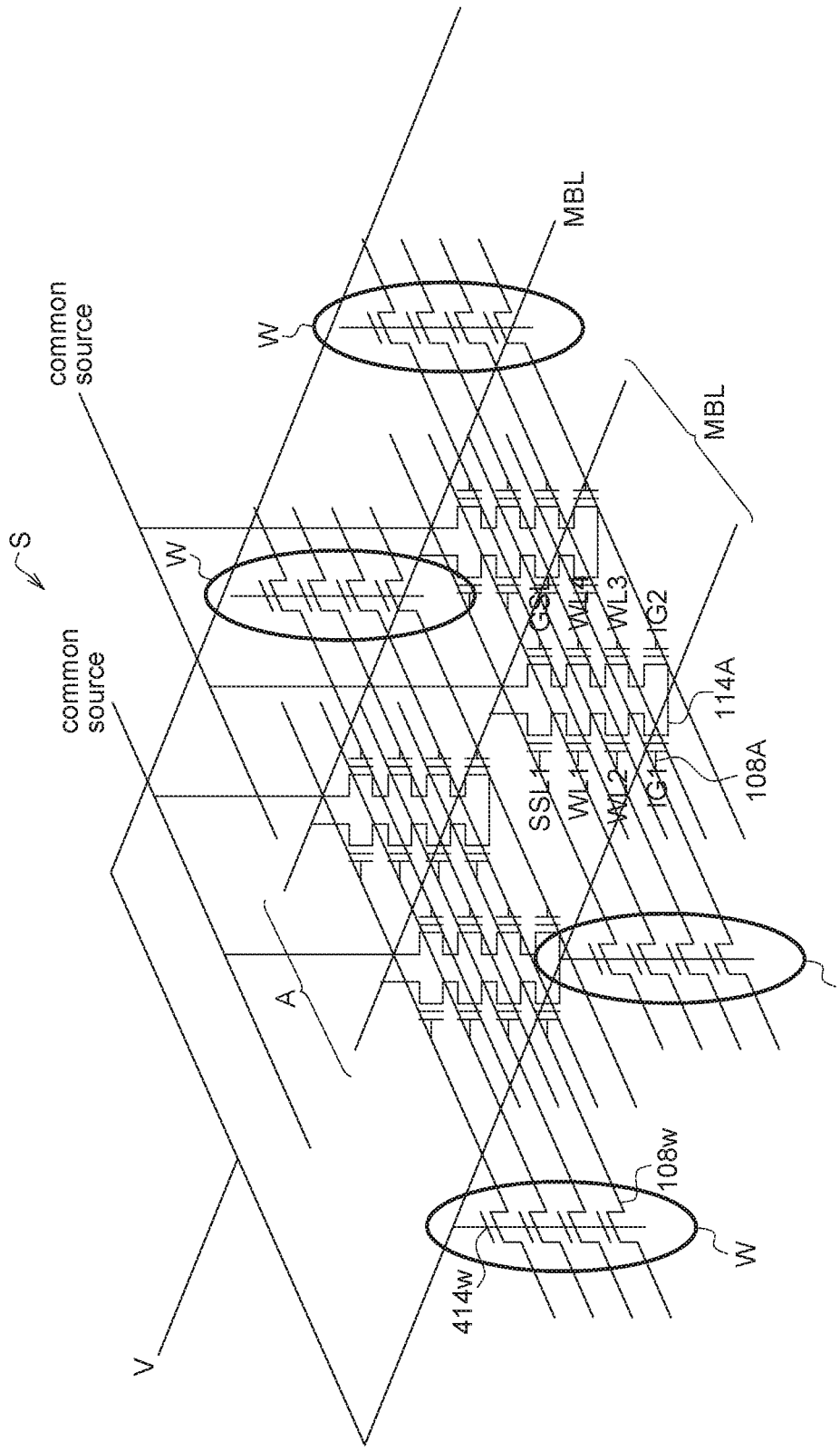
FIG. 4 is a circuit diagram of a memory segment of a memory structure according to an embodiment.

FIG. 4 is a circuit diagram of one memory segment S of the memory structure according to an embodiment. A terminal of the semiconductor channel 108W in the memory selecting region W, away from the memory array region A, may be electrically connected to a word line driver. Opposing terminals of the U-type channel layer 114A (FIG. 1C) in the memory array region A may be electrically connected to a common source and a bit line (MBL), respectively. The semiconductor gate electrode 108A of one NAND string in the memory array region A may comprise SSL1, WL, IG, and GSL. As shown in FIG. 4, one NAND string may have two selecting devices. In an embodiment, the memory segments S may share a common bit line.

A voltage bias applied from a terminal V to the gate electrode layer 414W of the selecting device may be controlled to turn on (ON) or turn off (OFF) the selecting device, to decide if the memory segment S to be erased. For example, as the memory segment S is expected to be selected to be erased, the selecting device is turned on to allow data from the word line driver pass through the semiconductor channel 108W of the selecting device and then into the channel layer 114A of the memory cell array. As the un-selected memory segment S is expected to be not erased, during erasing the selected memory segment S, the selecting device in the un-selected memory segment S is turned off, to inhibit data from the word line driver to pass the selecting device, and make all the word lines floating.

The present disclosure is not limited to four conductive levels of the strip stack as shown in FIG. 3 or FIG. 4. A larger amount of conductive levels may be used to construct a memory structure having a higher memory cell density. The similar concept may be applied to other elements.

Figure 5:
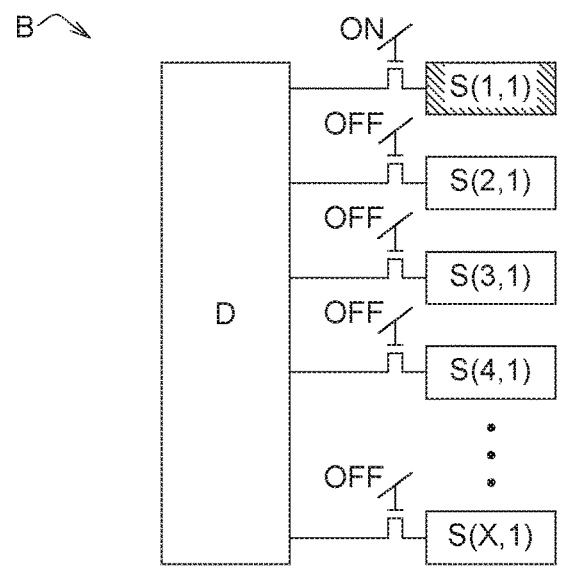
FIG. 5 illustrates an operating method for a memory structure according to an embodiment.
Figure 6:
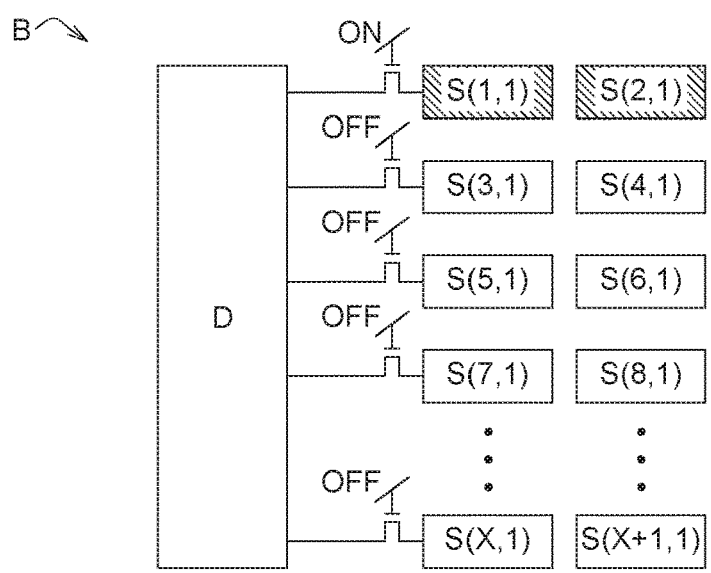
FIG. 6 illustrates an operating method for a memory structure according to an embodiment.
Figure 7:
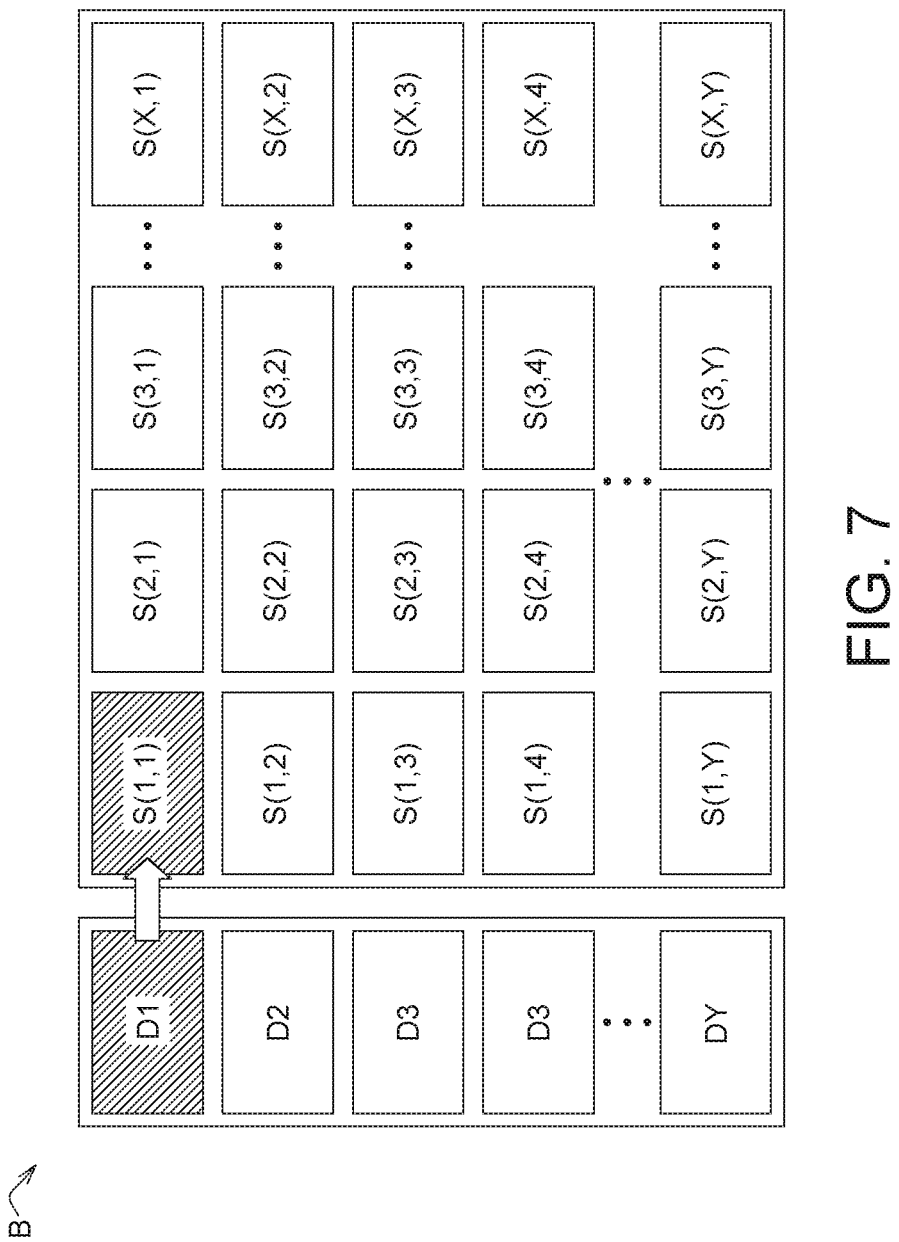
FIG. 7 illustrates an operating method for a memory structure according to an embodiment.

FIG. 5 to FIG. 7 illustrate methods for operating the memory structures according to various embodiments. A memory block B comprises memory segments S(X,Y). In embodiments, each of the memory segment S(X,Y) comprises the memory selecting region W having the selecting device. The memory segments S(X,Y) sharing a commonly used word line driver D (or D1 to DY) can be independently controlled to be in a selected state or in an un-selected state. Therefore, during an erasing operating, the memory cells in the memory array region A may be erased in a sequence from the memory cells in a selected memory segment S close to the word line driver D (or D1 to DY) toward the memory cells in an another selected memory segment S away from the word line driver D, and an un-selected memory segment S would not be erased, selectively. During reading and programming a selected memory segment S, a corresponding selecting device may be turned on.

Figure 8:
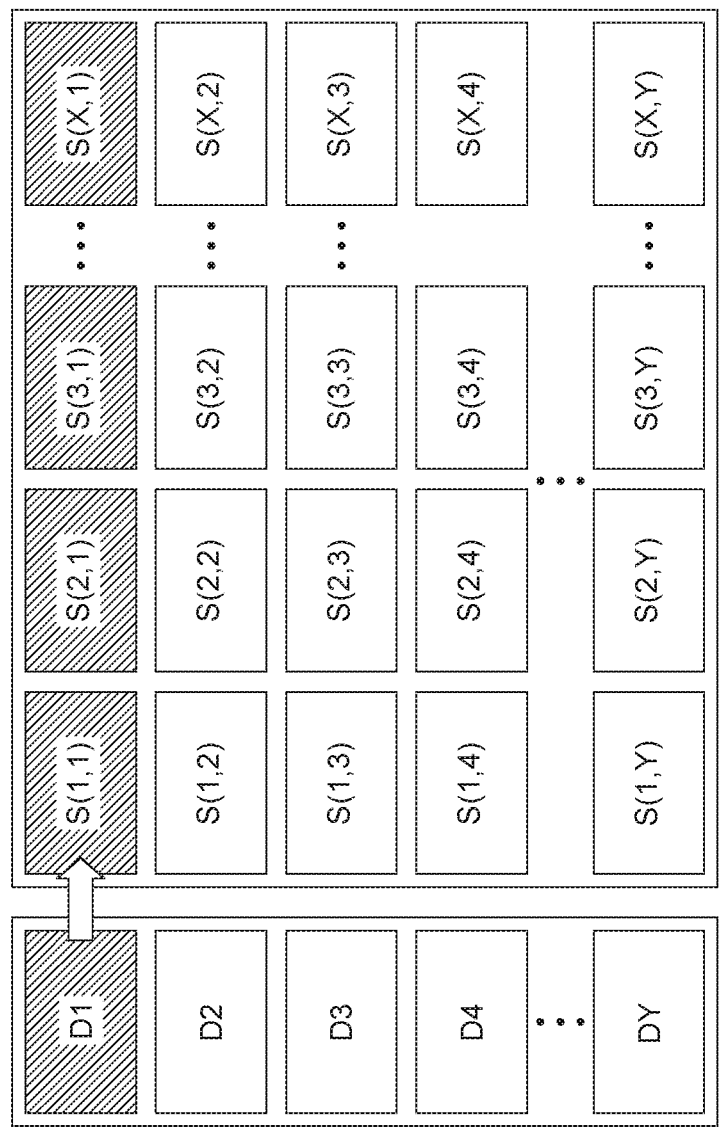
FIG. 8 illustrates an operating method for a memory structure of a comparative example.

FIG. 8 illustrates a method for operating a memory structure of a comparative example. The memory segment S of the memory structure of comparative example has no memory selecting region, in other words has no selecting device. Therefore, during an erasing operating, all of the memory segments S using one common word line driver D have to be erased simultaneously.

Accordingly, in embodiments, the memory structure comprises the memory segments S having the selecting devices, and thus the memory segments S can be erased selectively. The erasing operating can be easy and convenient.

FIG. 9A to FIG. 18B illustrate a method for manufacturing the memory structure according to an embodiment. In this example, the gate dielectric layer in the memory selecting region and the gate dielectric layer of the memory array region may be formed simultaneously. Alternatively, the gate electrode layer in the memory selecting region and the channel layer in the memory array region may be formed simultaneously. Thus, no extra process is needed for the selecting device of the memory structure. The manufacturing method is easy.

Figure 9A:
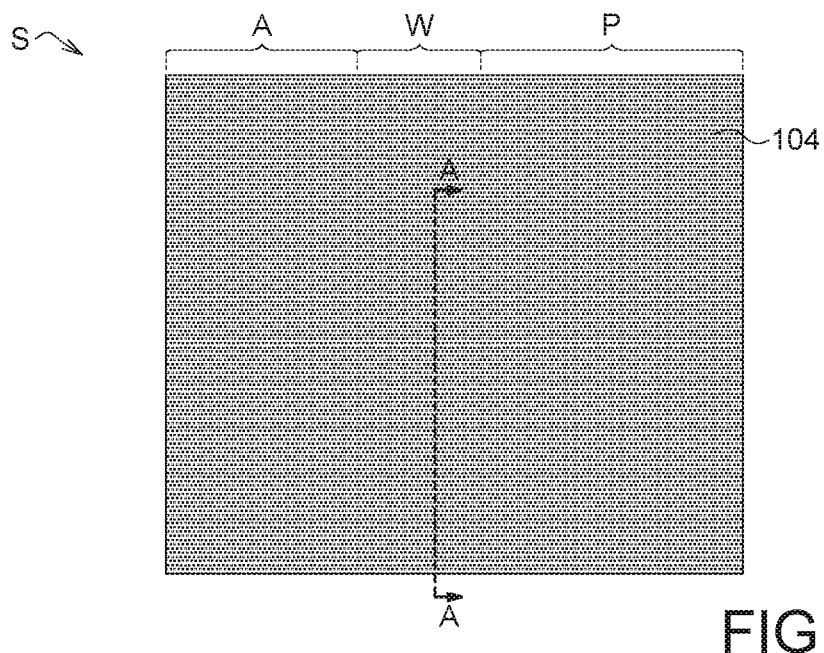
FIG. 9A to FIG. 18B illustrate a method for manufacturing a memory structure according to an embodiment.
Figure 9B:
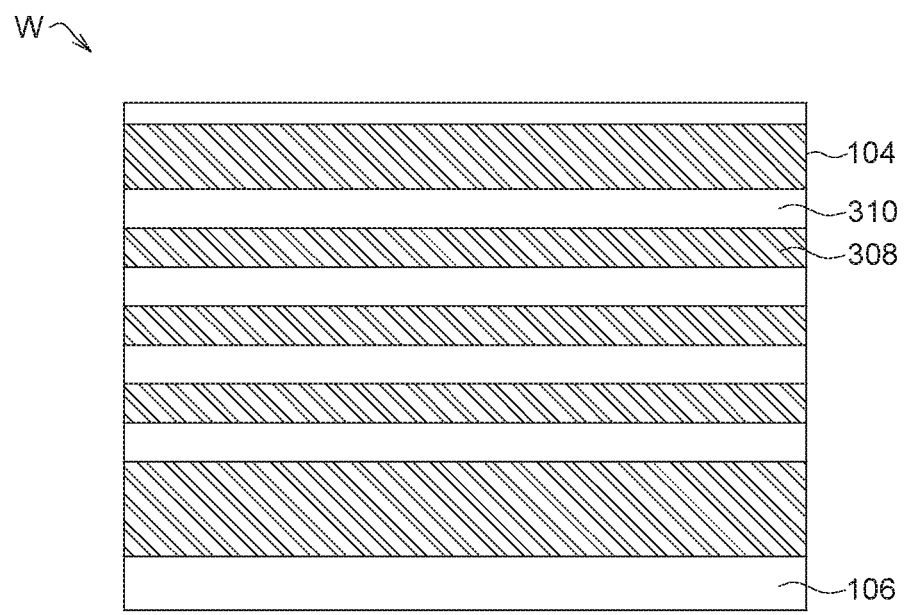

FIG. 9A is a schematic top view of the memory structure. FIG. 9B is a schematic cross-section view of the memory structure taken along AA line in FIG. 9A. The concept is also applied to FIGS. 10 to 18 marked with A and B. Referring to FIGS. 9A and 9B, semiconductor films 308 and insulating films 310 are stacked on the substrate 106 to form the stack structure 104. The semiconductor film 308 may comprise polysilicon, or other suitable semiconductor materials. In an embodiment, the insulating film 310 may comprise an oxide such as silicon oxide. However, the present disclosure is not limited thereto. The insulating film 310 may comprise a nitride such as silicon nitride, or other suitable insulating materials.

Figure 10A:
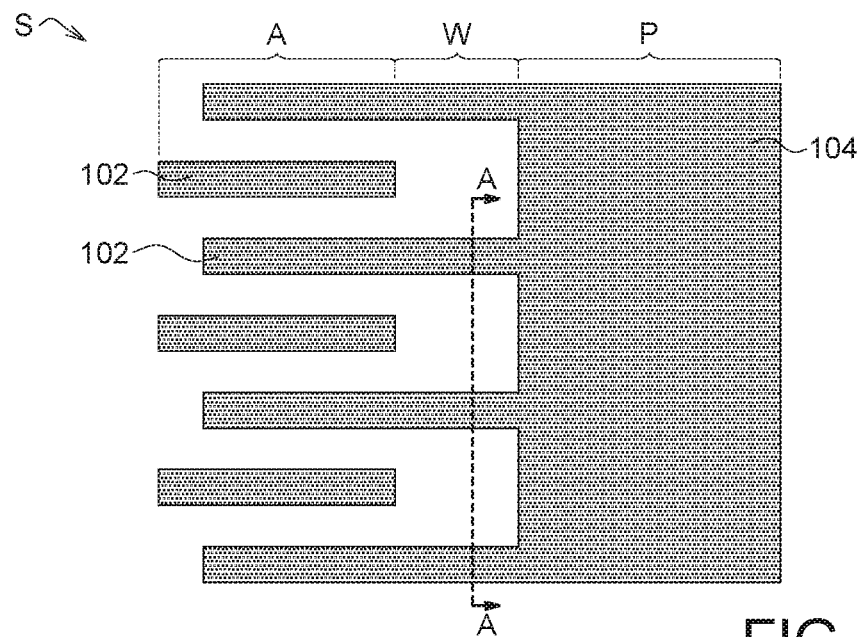
Figure 10B:
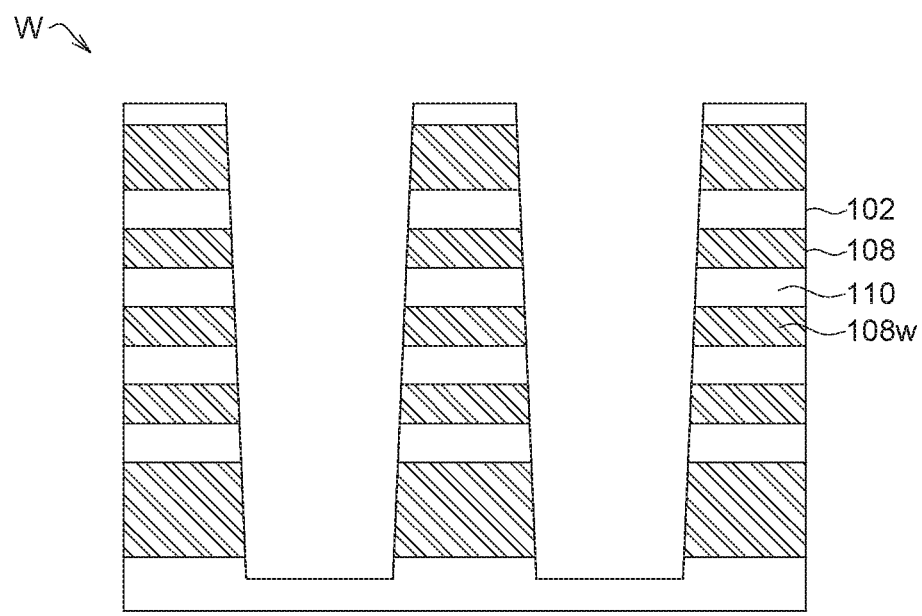

Referring to FIGS. 10A and 10B, the stack structure 104 is patterned to form strip stacks 102 extending from a sidewall of the pad region P. As shown in FIG. 10B, the strip stack 102 comprises semiconductor strips 108 and the insulating strips 110 stacking alternately. Each of the semiconductor strips 108 comprises the semiconductor channel 108W in the memory selecting region W and the semiconductor gate electrode 108A in the memory array region A (FIG. 1C). In an embodiment, the connecting semiconductor channel 108W and semiconductor gate electrode 108A are defined by this pattern step simultaneously. The patterning step may be performed by using a lithographic and etching technique, and the similar concept would not be described again herein.

Figure 11A:
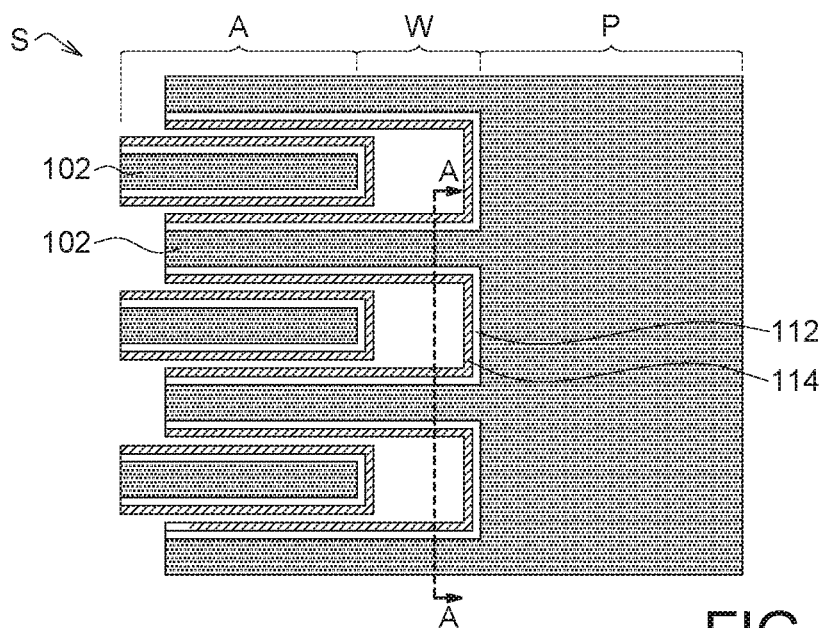
Figure 11B:
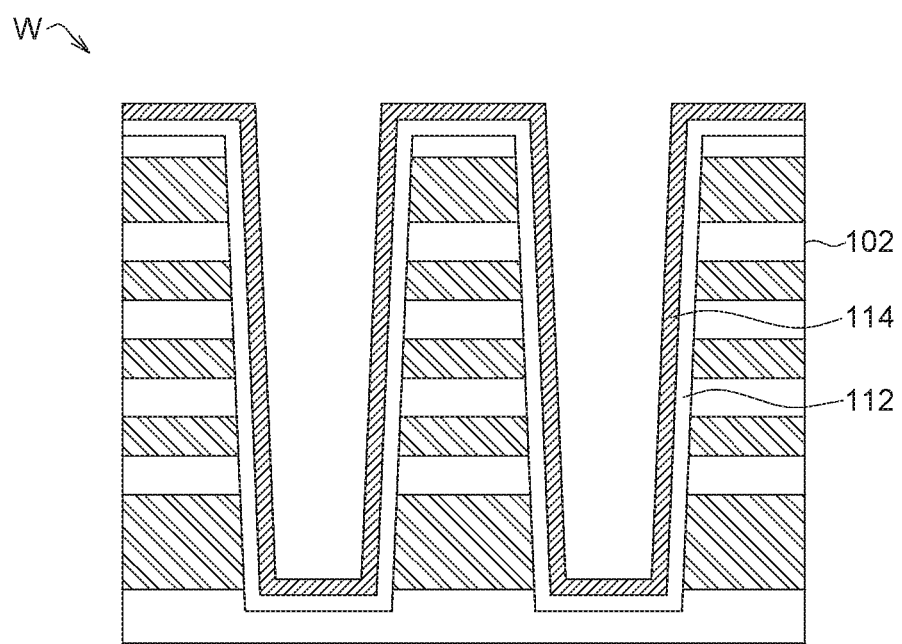

Referring to FIGS. 11A and 11B, the gate dielectric layer 112 is formed on the stack structure 104 in the pad region P and the strip stack 102. Then, the semiconductor layer 114 is formed on the gate dielectric layer 112. The gate dielectric layer 112 may comprise an oxide such as silicon oxide, a nitride such as silicon nitride, or other suitable dielectric materials. In an embodiment, for example, the gate dielectric layer 112 is a multi-layer structure of oxide-nitride-oxide (ONO). In another embodiment, for example, the gate dielectric layer 112 is a multi-layer structure of oxide-nitride-oxide-nitride-oxide (ONONO). In some embodiments, the gate dielectric layer 112 may have a single-layer structure. The semiconductor layer 114 may comprise polysilicon, or other suitable semiconductor materials.

Figure 12A:
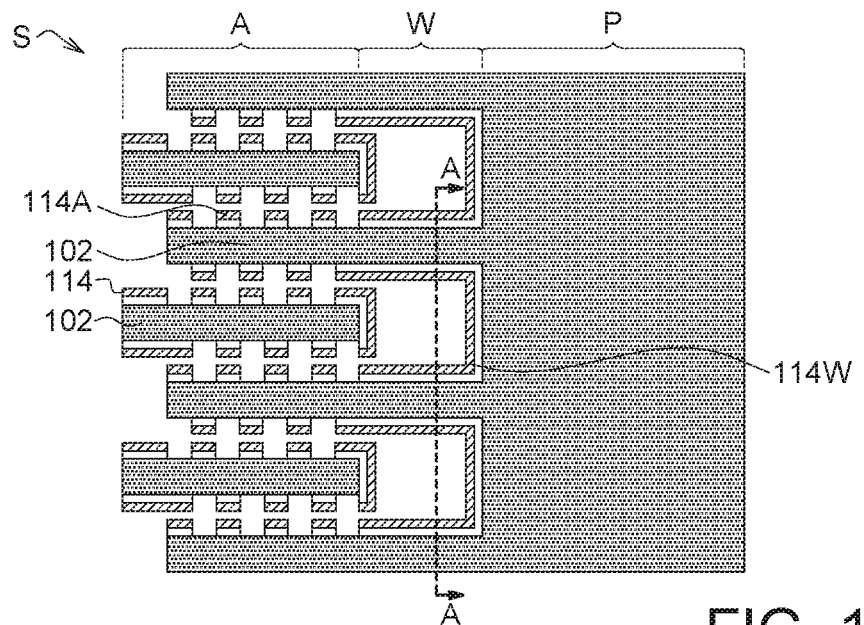
Figure 12B:
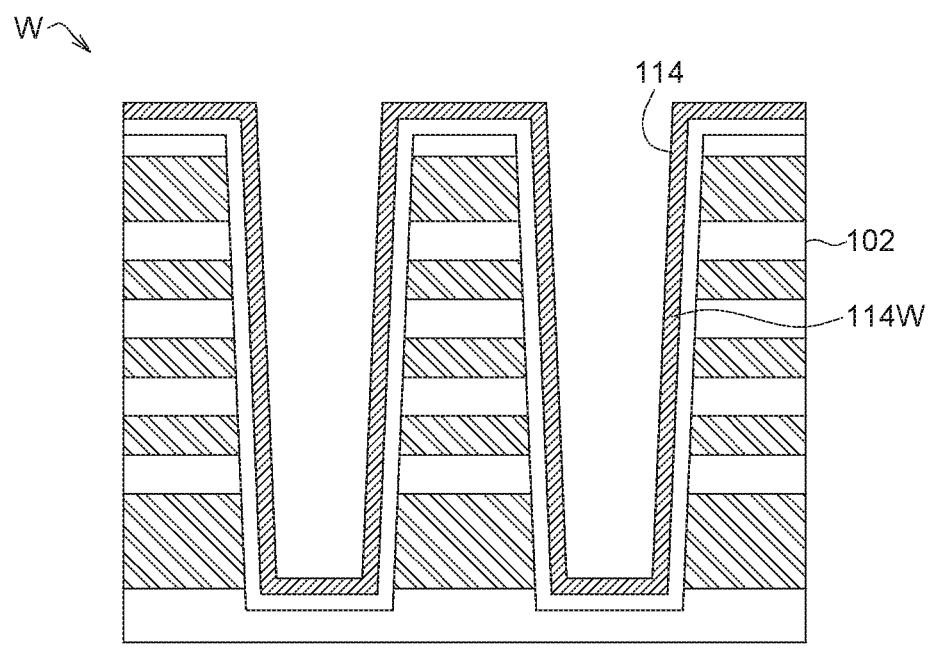

Referring to FIGS. 12A and 12B, the semiconductor layer 114 is patterned to form the gate electrode layer 114W and the channel layer 114A separated from each other on a sidewall of the strip stack 102. In an embodiment, the gate electrode layer 114W and the channel layer 114A separated from each other on the sidewall of the strip stack 102 are defined by this patterning step simultaneously. In addition, the gate dielectric layer 112 may be patterned.

Figure 13A:
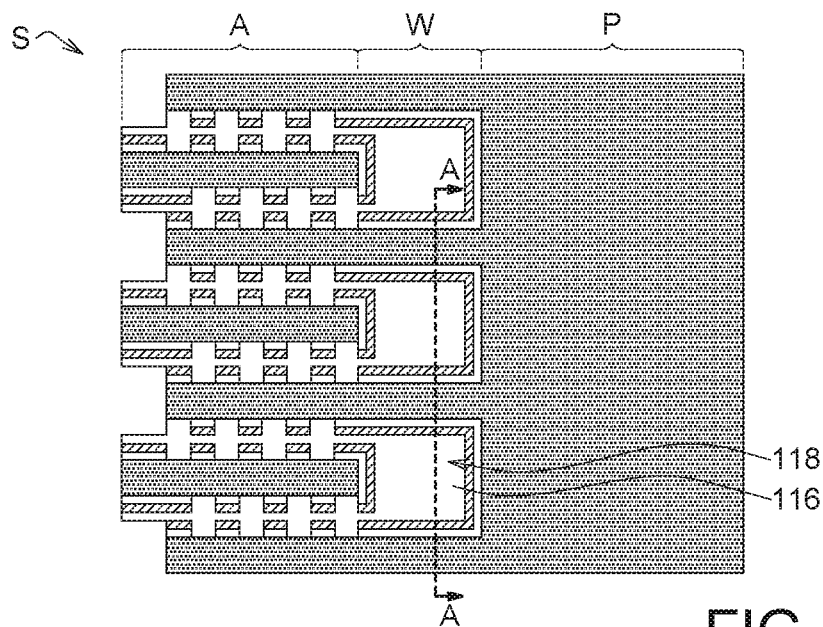
Figure 13B:
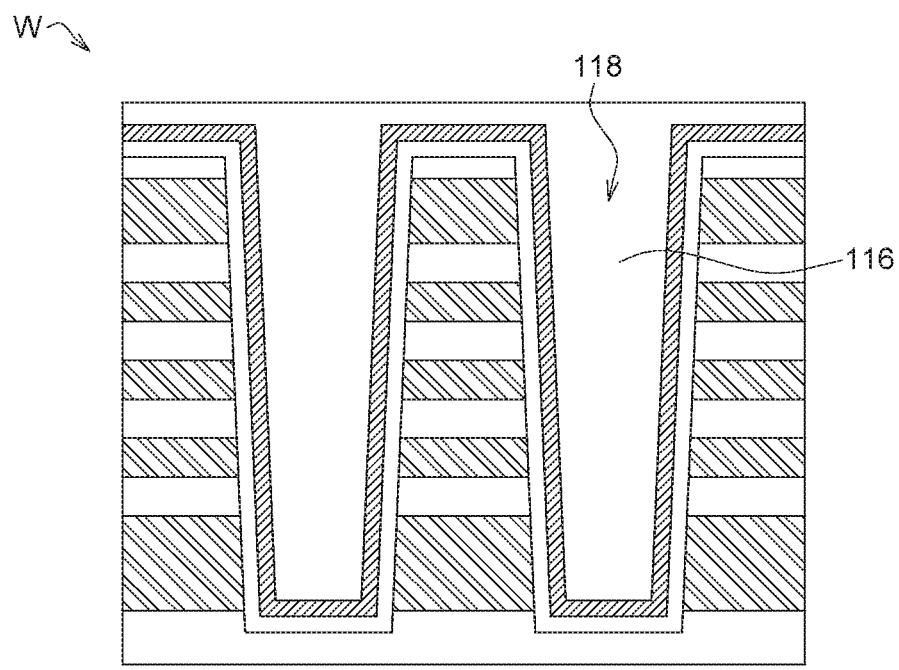

Referring to FIGS. 13A and 13B, the insulating layer 116 is filled into the opening 118. In an embodiment, the insulating layer 116 comprises an oxide such as silicon oxide. However, the present disclosure is not limited thereto. The insulating layer 116 may comprise a nitride such as silicon nitride, or other suitable insulating materials. The insulating layer 116 may be formed by a deposition method such as PVD or CVD.

Figure 14A:
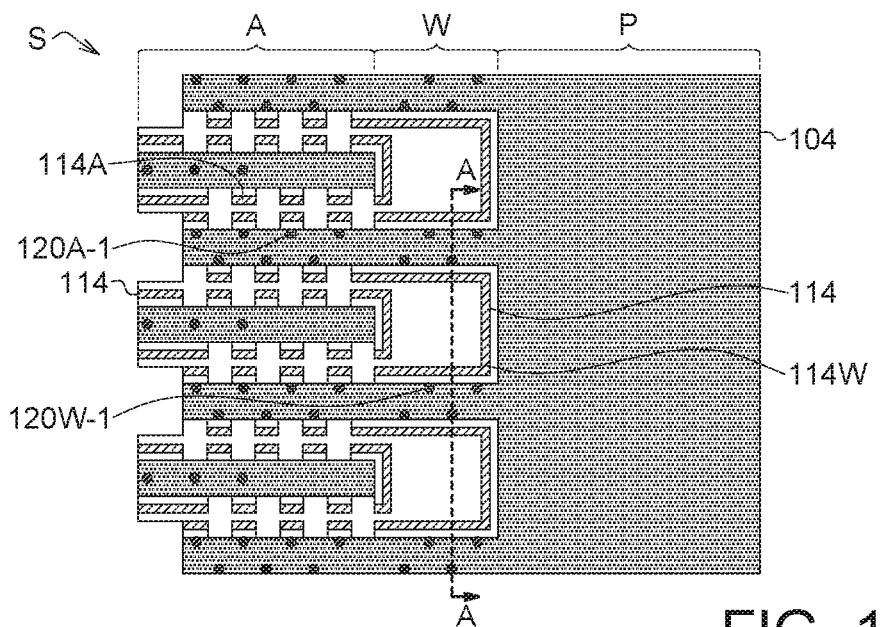
Figure 14B:
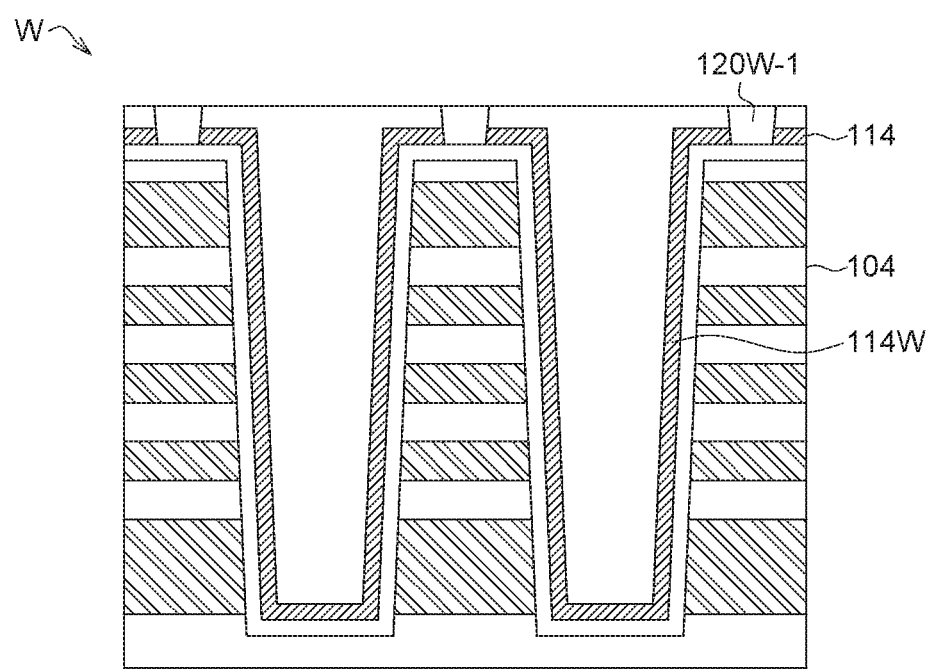

Referring to FIGS. 14A and 14B, conductive connecting elements 120A-1, 120W-1 are formed, landing on the semiconductor layer 114 over the upper surface of the stack structure 104 to electrically connected to the gate electrode layer 114W and the channel layer 114A. The conductive connecting elements 120A-1, 120W-1 may be conductive plugs formed with a doped polysilicon. In other embodiments, the conductive connecting elements 120A-1, 120W-1 may comprise a metal such as W, or other materials having good conductivity.

Figure 15A:
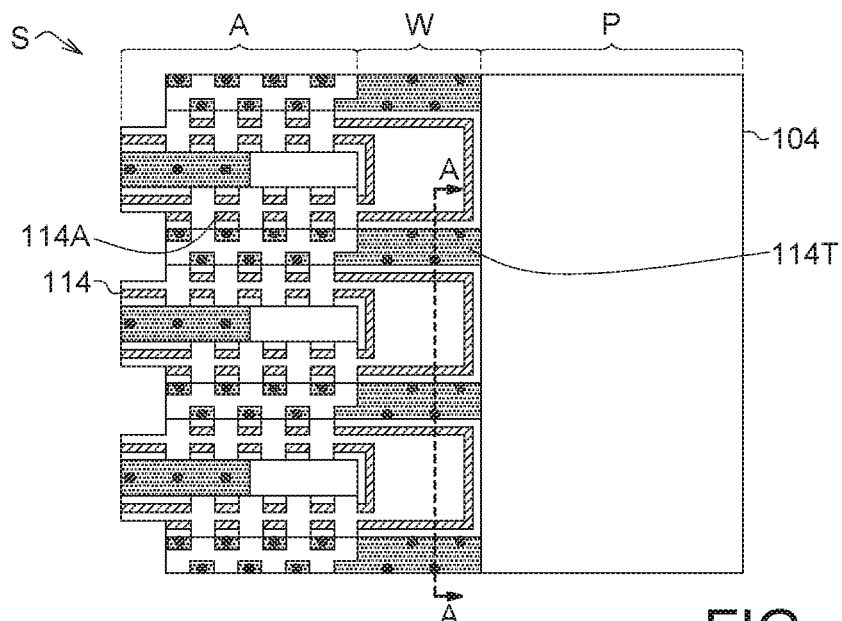
Figure 15B:
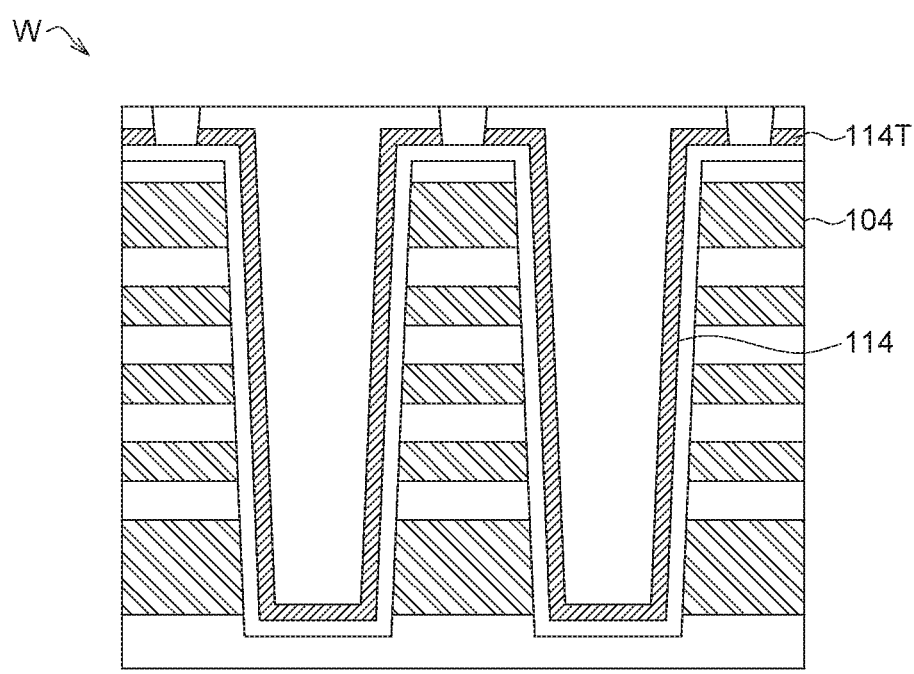

Referring to FIGS. 15A and 15B, a portion of the semiconductor layer 114 over the upper surface of the stack structure 104 is removed by a patterning step. For example, a remaining portion of the semiconductor layer 114 over the upper surface of the stack structure 104 comprises the semiconductor portion 114T in the memory selecting region W and the memory array region A.

Figure 16A:
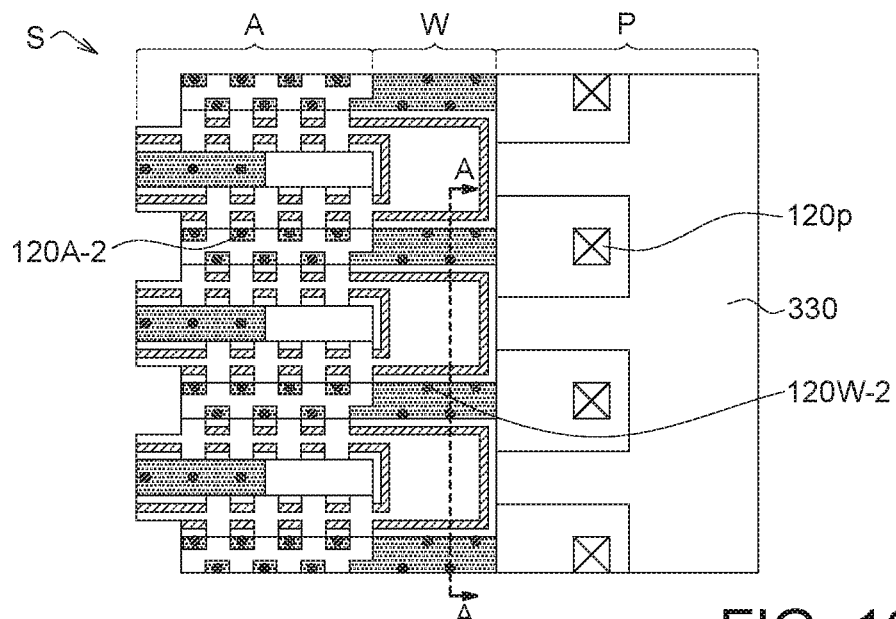
Figure 16B:
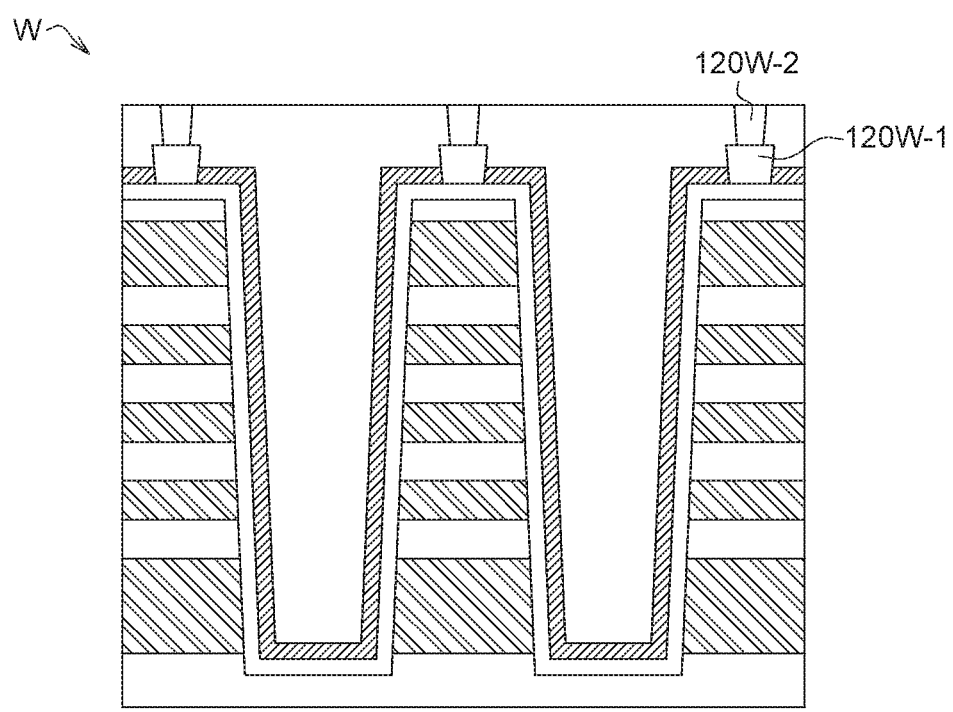

Referring to FIGS. 16A and 16B, in some embodiments, the conductive connecting elements 120A-2, 120W-2, 120P may be formed. The conductive connecting element 120P in the pad region P may be landed on a SSL semiconductor film. The conductive connecting elements 120A-2-120W-2 may be landed on the conductive connecting elements 120A-1-120W-1 (FIGS. 14A and 14B). In some embodiments, conductive connecting elements (not shown) may be formed to be landed on the semiconductor films of different levels in the stair structure 330 in the pad region P. The conductive connecting elements 120A-2, 120W-2, 120P may be conductive plugs formed with a doped polysilicon. In other embodiments, the conductive connecting elements 120A-2, 120W-2, 120P may comprise a metal such as W, or other materials having good conductivity.

Figure 17A:
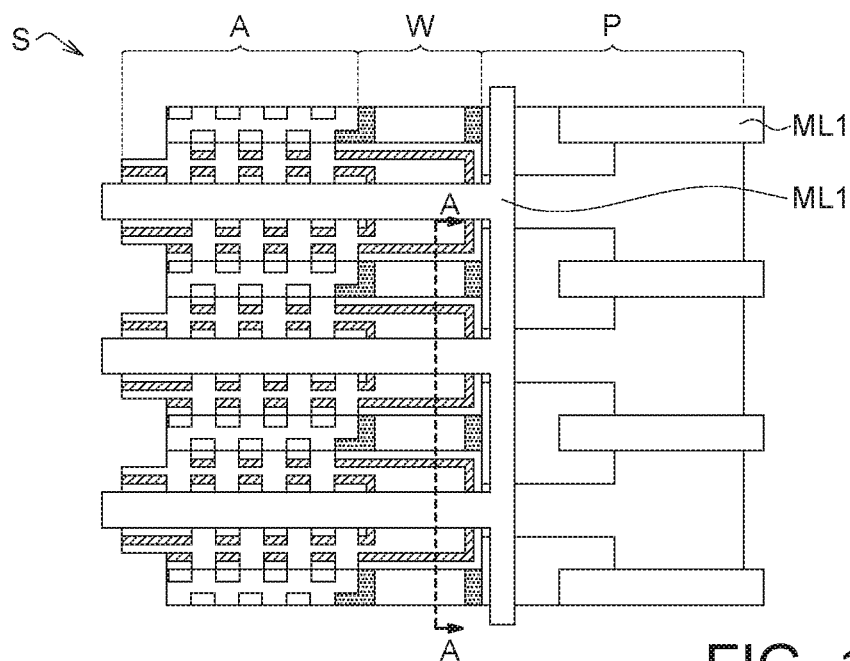
Figure 17B:
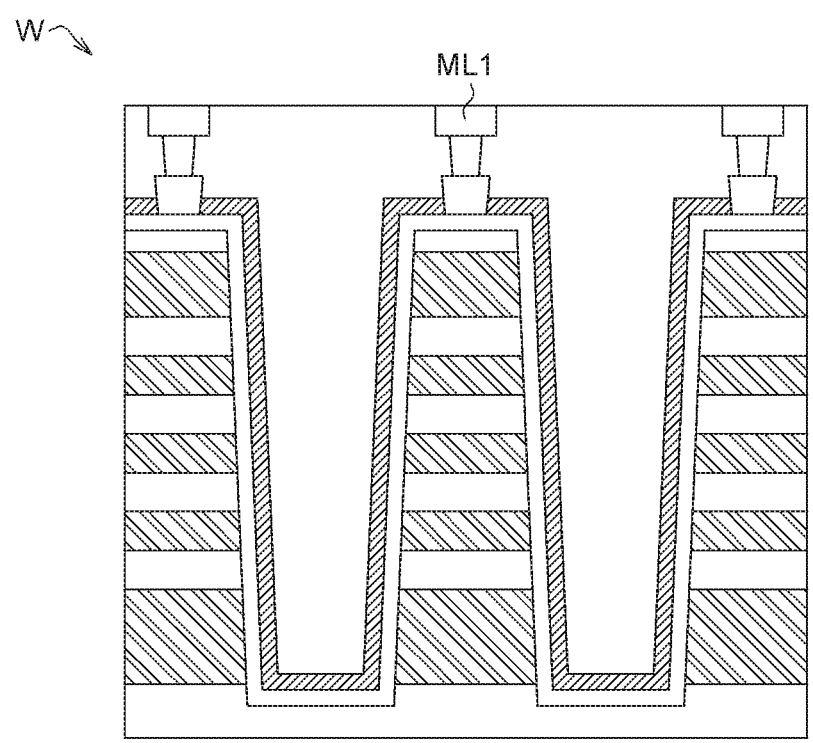

Referring to FIGS. 17A and 17B, a first metal layer ML1 may be formed to electrically connected to the conductive connecting elements 120A-2, 120W-2, 120P (FIGS. 16A and 16B).

Figure 18A:
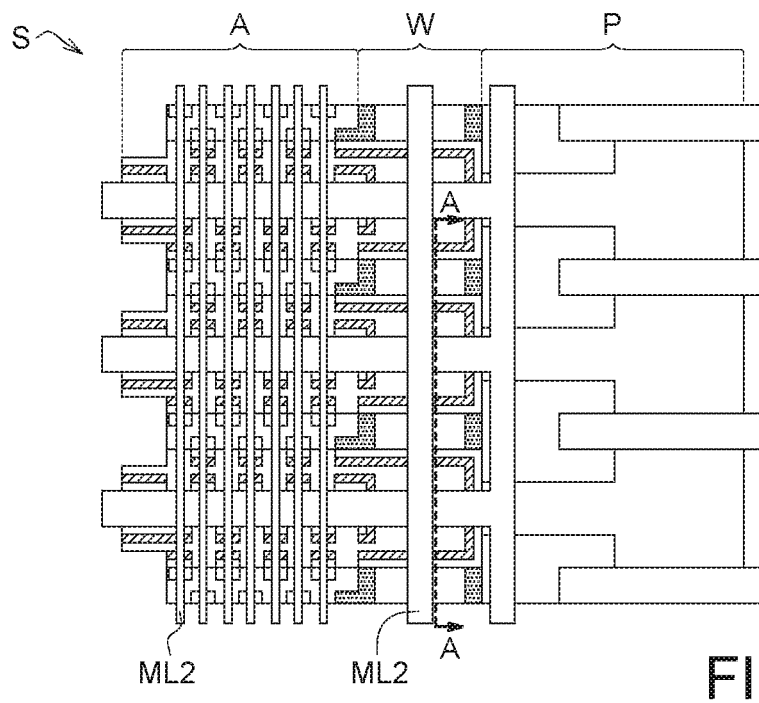
Figure 18B:
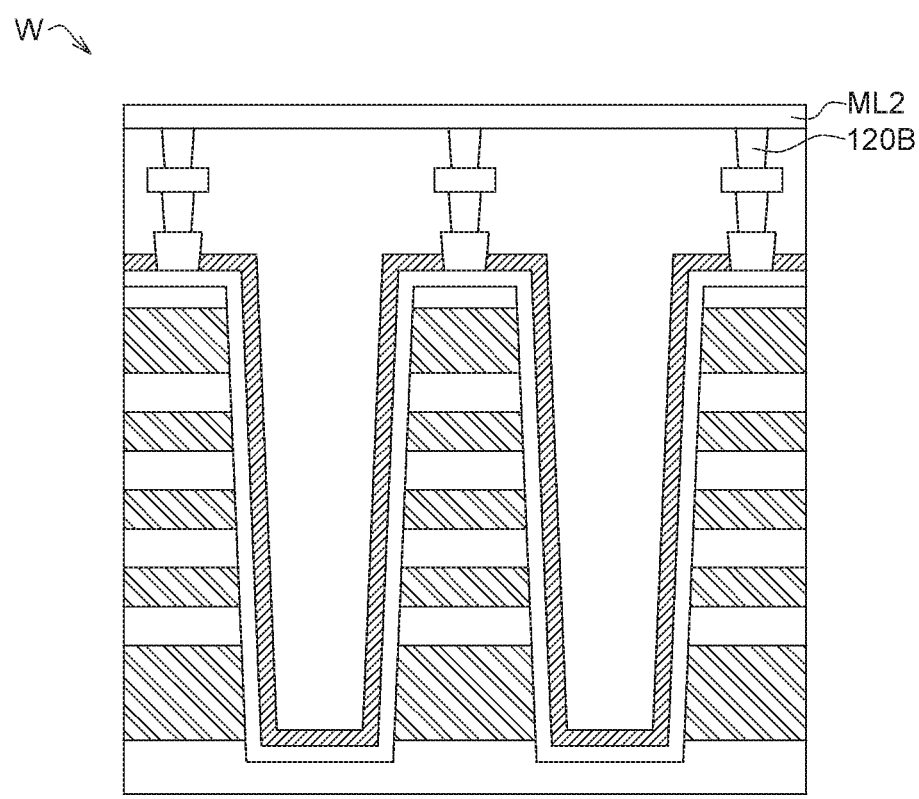

Referring to FIGS. 18A and 18B, for example, the conductive connecting element 120B and the second metal layer ML2 may be formed to electrically connect to the first metal layer ML1.

The manufacturing method of the present disclosure is not limited to the process flow as shown in FIG. 9A to FIG. 18B, and may be varied according to actual designs.

For example, FIG. 19A to FIG. 25B illustrate a manufacturing method for the memory structure according to another embodiment. In this example, the gate dielectric layer in the memory selecting region and the gate dielectric layer of the memory array region are formed by separating steps, and thus the gate dielectric layers in the different regions may be formed by different dielectric materials optionally. Otherwise, the gate electrode layer in the memory selecting region and the channel layer in the memory array region are formed by separating steps, and thus the gate electrode layer and the gate electrode layer may be formed by different materials optionally.

Figure 19A:
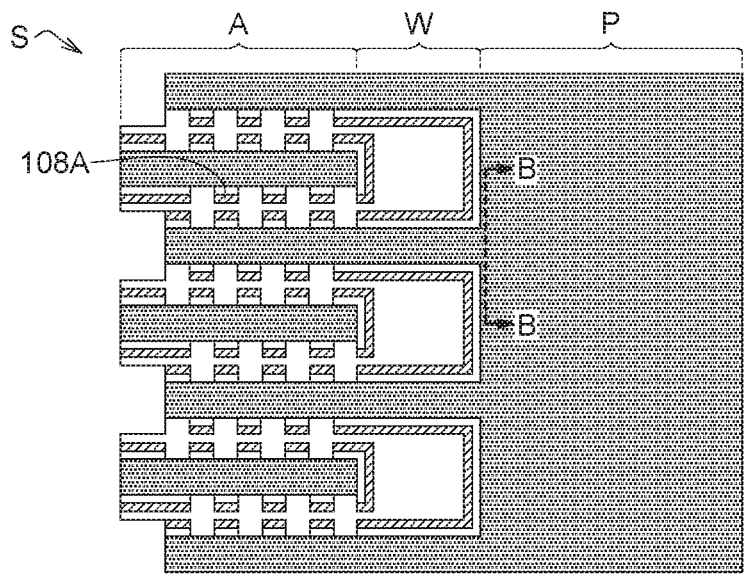
FIG. 19A to FIG. 25B illustrate a method for manufacturing a memory structure according to an embodiment.
Figure 19B:
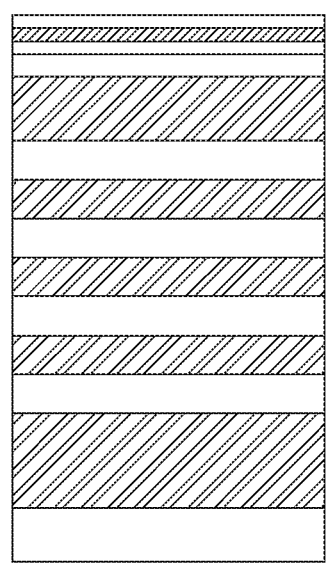

In some embodiments, process steps before the step as shown by FIGS. 19A and 19B in this example are similar to those shown by FIGS. 9A and 12B, and thus are not described herein.

FIG. 19A, similar to FIG. 13A, is a schematic top view of the memory structure. FIG. 19B is a schematic cross-section view of the memory structure taken along BB line in FIG. 19A. The concept is also applied to FIGS. 20 to 25 marked with A and B. Referring to FIGS. 19A and 19B, the memory structure comprises the memory selecting region W between the pad region P and the memory array region A. The memory cells (separated semiconductor gate electrodes 108A) in the memory array region A are defined.

Figure 20A:
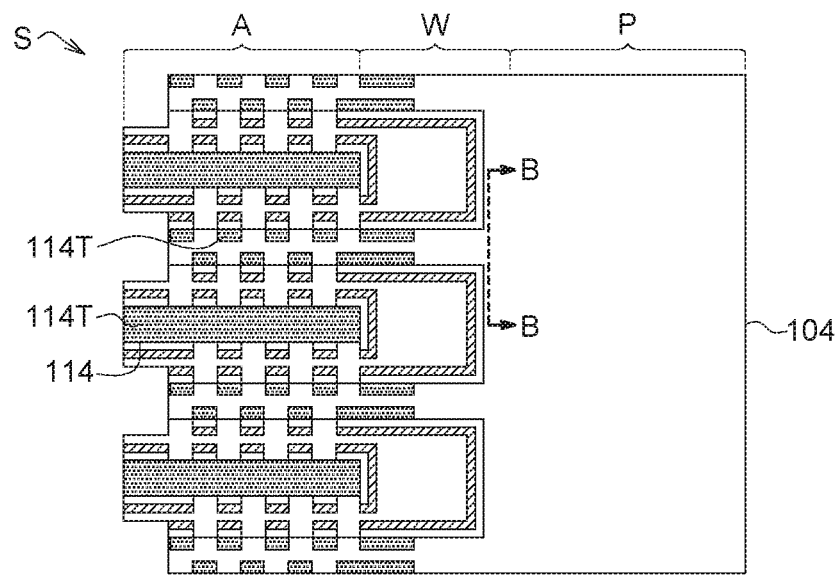
Figure 20B:
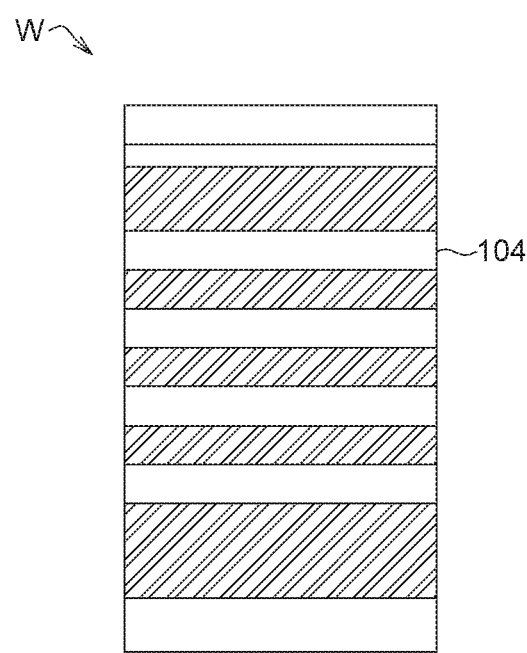

Referring to FIGS. 20A and 20B, then, a portion of the semiconductor layer 114 over the upper surface of the stack structure 104 is removed by a pattering step. For example, a remaining portion of the semiconductor layer 114 over the upper surface of the stack structure 104 comprises the semiconductor portion 114T in the memory array region A.

Figure 21A:
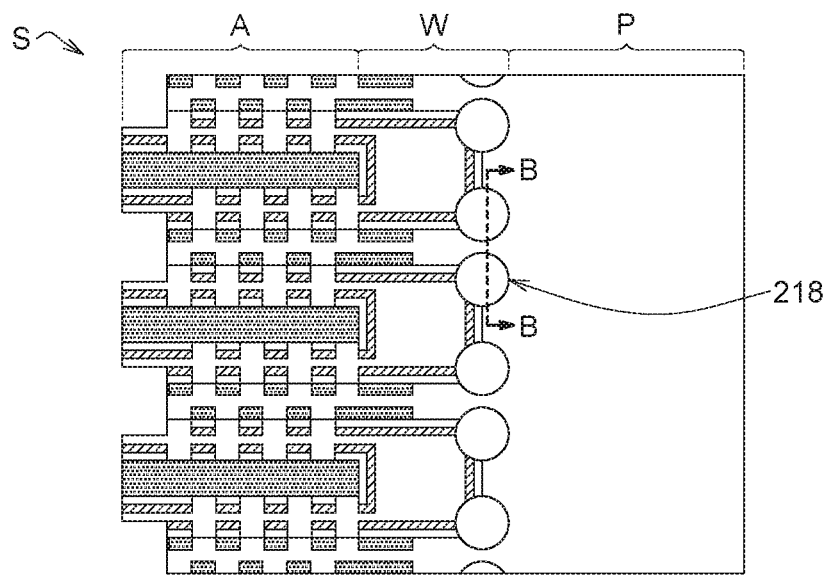
Figure 21B:
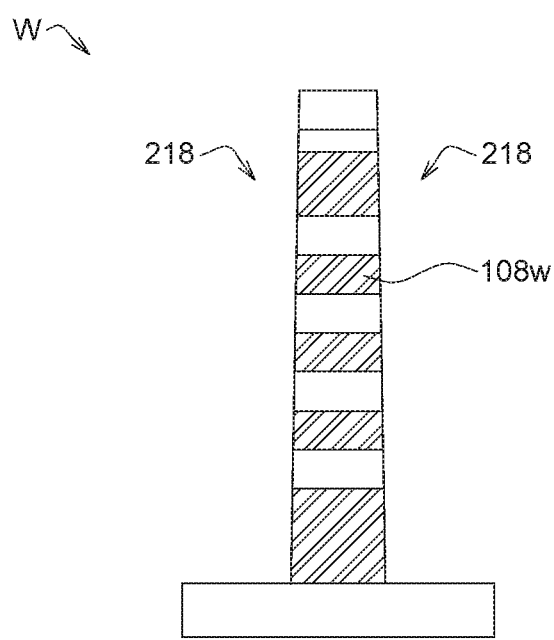

Referring to FIGS. 21A and 21B, next, the opening 218 exposing the semiconductor channel 108W in the memory selecting region W may be formed by using a lithographic and etching technique.

Figure 22A:
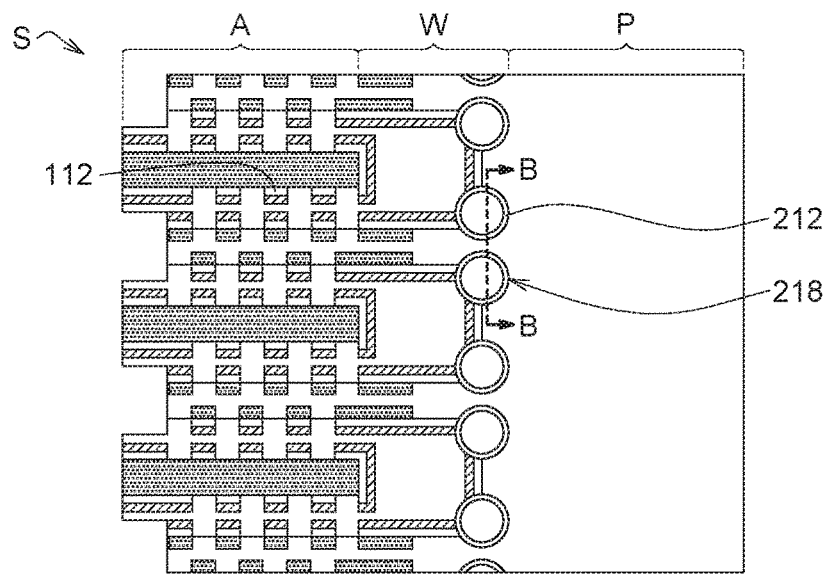
Figure 22B:
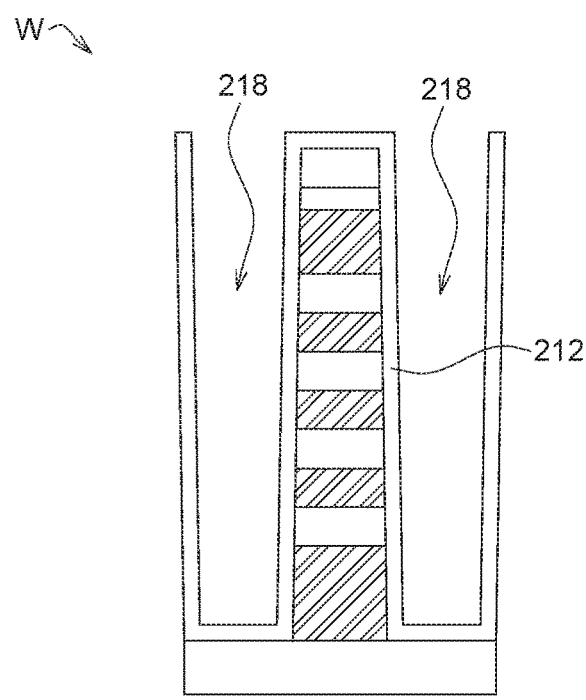

Referring to FIGS. 22A and 22B, the gate dielectric layer 212 is formed on the sidewall and the bottom surface of the opening 218. The gate dielectric layer 212 may comprise an oxide such as silicon oxide, a nitride such as silicon nitride, or other suitable dielectric materials. In an embodiment, the gate dielectric layer 212 in the memory selecting region W may be formed by using a dielectric material different from a dielectric material of the gate dielectric layer 112 in the memory array region A. However, the present disclosure is not limited thereto. The gate dielectric layer 112 and the gate dielectric layer 212 may be formed by using the same dielectric material.

Figure 23A:
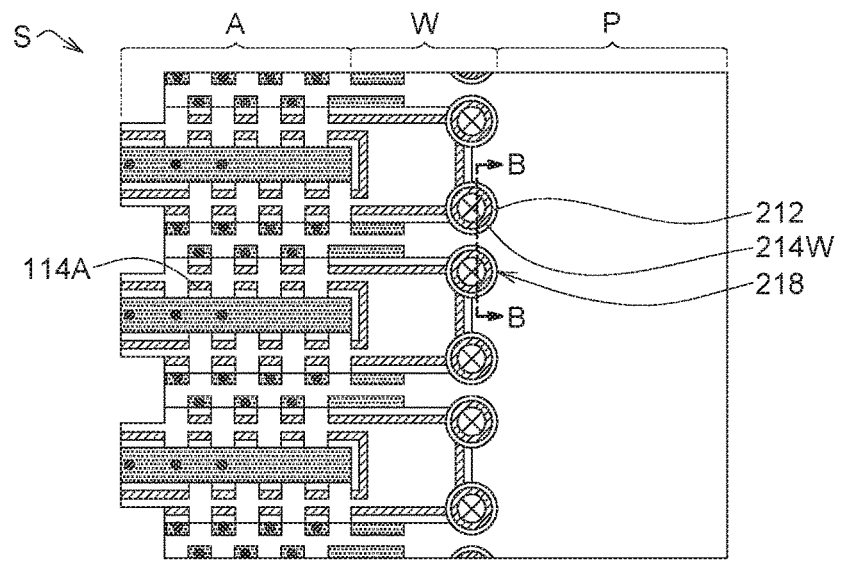
Figure 23B:
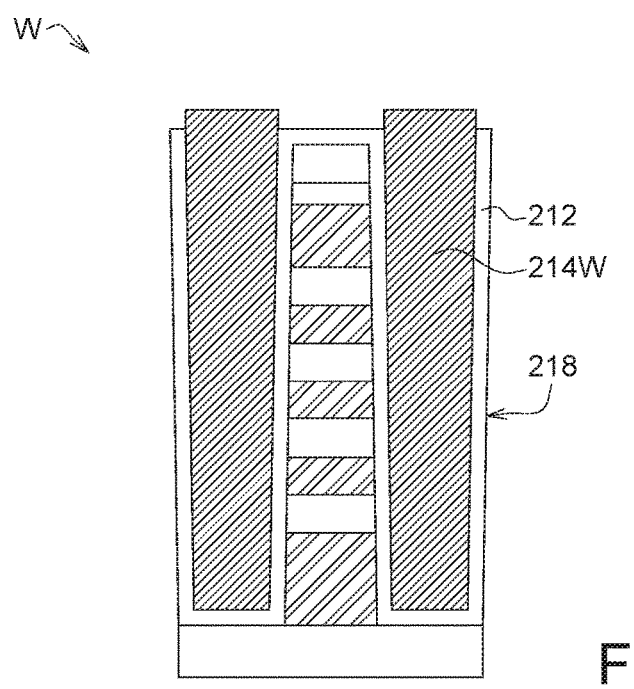

Referring to FIGS. 23A and 23B, the gate electrode layer 214W is formed on the gate dielectric layer 212, and filled into the opening 218. In an embodiment, the gate electrode layer 214W may comprise polysilicon, or other suitable semiconductor materials. In another embodiment, the gate electrode layer 214W may be formed by a conductive material different from a material of the channel layer 114A. For example, gate electrode layer 214W may use a metal such as W, or other materials having excellent conductivity, to form the selecting device having better controlling ability.

Figure 24A:
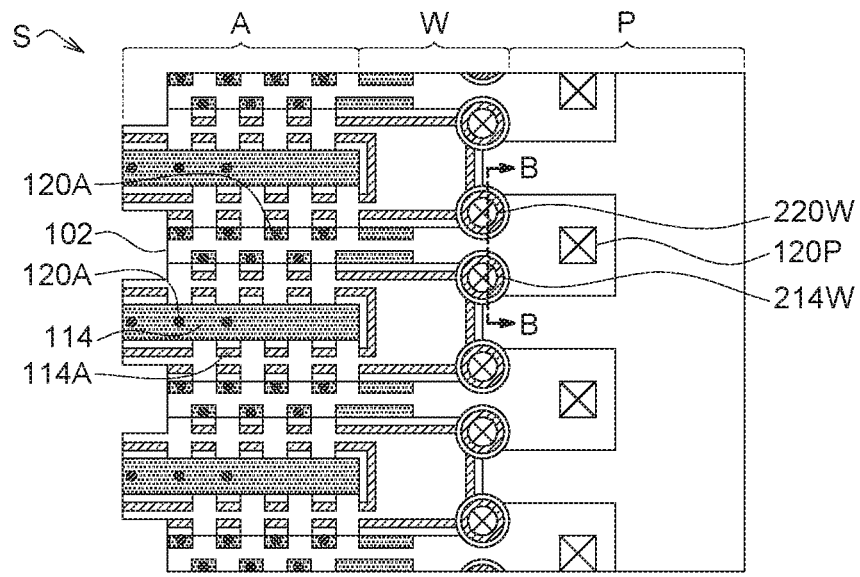
Figure 24B:
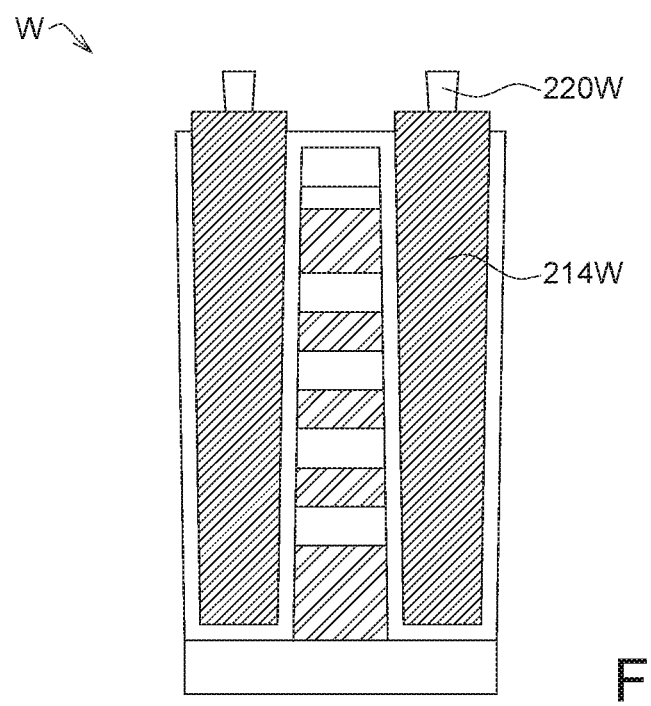

Referring to FIGS. 24A and 24B, the conductive connecting elements 120A, 220W, 120P may be formed. The conductive connecting element 120A may be landed on the semiconductor layer 114 over the upper surface of the strip stack 102 in the memory array region A to electrically connect to the channel layer 114A. The conductive connecting element 220W may be landed on the gate electrode layer 214W in the memory selecting region W. The conductive connecting element 120P may be landed on the SSL semiconductor film in the pad region P.

Figure 25A:
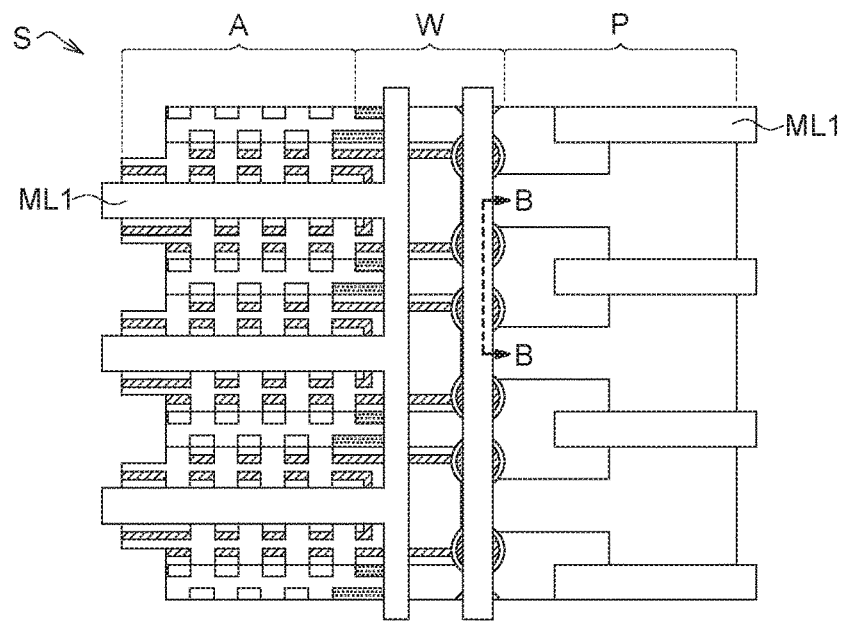
Figure 25B:
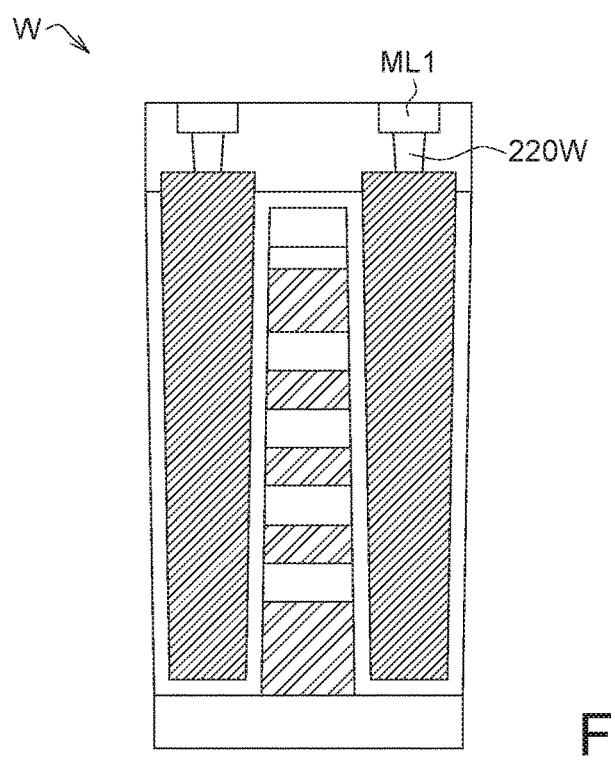

Referring to FIGS. 25A and 25B, the first metal layer ML1 is formed to electrically connect to the conductive connecting elements 120A, 220W, 120P.

Accordingly, in embodiments, the memory segments of the memory structure have the selecting devices, and thus the memory segments in the memory block can be erased partially optionally. The partial erasing method is easy and convenient.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising memory segments, each comprising:
   a memory array region;
   a memory selecting region adjacent to the memory array region;
   a semiconductor strip extended in the memory array region and the memory selecting region as a continuous strip structure, and comprising a semiconductor gate electrode and a semiconductor channel, wherein the semiconductor gate electrode is in the memory array region, and the semiconductor channel is in the memory selecting region;
   a gate dielectric layer;
   a gate electrode layer, wherein the gate electrode layer and the semiconductor channel are in the memory selecting region, the gate electrode layer and the semiconductor channel are separated from each other by the gate dielectric layer; and
   a channel layer, wherein the channel layer and the semiconductor gate electrode are in the memory array region, the channel layer and the semiconductor gate electrode are separated from each other by the gate dielectric layer.

2. The memory structure according to claim 1, further comprising a word line driver, wherein the memory selecting region of one of the memory segment S is between the memory array region of the one of the memory segment S and the word line driver.

3. The memory structure according to claim 1, further comprising a word line driver, wherein the memory selecting regions are between the memory array regions of the memory segment S.

4. The memory structure according to claim 1, further comprising one word line driver, wherein the one word line driver are commonly used by the memory segment S.

5. The memory structure according to claim 1, wherein the gate electrode layer, the semiconductor channel and the gate dielectric layer in the memory selecting region form a word line selecting device.

6. The memory structure according to claim 1, comprising strip stacks each comprising a plurality of the semiconductor strips stacking and separating from each other, wherein each of the semiconductor strips comprises the semiconductor gate electrode and the semiconductor channel.

7. The memory structure according to claim 6, comprising a substrate, wherein the gate electrode layer is extended on facing sidewalls of adjacent two of the strip stacks and on the substrate between the adjacent two of the strip stacks.

8. The memory structure according to claim 6, wherein the gate electrode layer is filled into an opening between adjacent two of the strip stacks.

9. The memory structure according to claim 6, comprising a substrate, wherein the channel layer is extended on facing sidewalls of adjacent two of the strip stacks and on the substrate between the adjacent two of the strip stacks.

10. The memory structure according to claim 6, wherein two terminals of the channel layer on adjacent two of the strip stacks are electrically connected to a common source and a bit line, respectively.

* * * * *